(12) United States Patent
Huang

(10) Patent No.: US 6,190,204 B1
(45) Date of Patent: Feb. 20, 2001

(54) PANEL ASSEMBLY FOR COMPACT PCI SYSTEM INTERFACE CARD

(75) Inventor: Tay-San Huang, Taipei (TW)

(73) Assignee: Advantech Co., Ltd., Taipei (TW)

( * ) Notice: Under 35 U.S.C. 154(b), the term of this patent shall be extended for 0 days.

(21) Appl. No.: 09/249,971

(22) Filed: Feb. 12, 1999

(30) Foreign Application Priority Data

Sep. 25, 1998 (TW) .............................................. 87215987

(51) Int. Cl.$^7$ ................................................ H01R 13/648
(52) U.S. Cl. ......................... 439/607; 439/573; 439/359
(58) Field of Search ...................................... 439/607, 359,
439/362, 363, 364, 365, 573, 571, 572;
361/686, 736, 737, 825; 174/35 GC

(56) References Cited

U.S. PATENT DOCUMENTS

| | | | |
|---|---|---|---|
| 4,929,184 | * 5/1990 | Emadi et al. | 439/681 |
| 5,833,494 | * 11/1998 | Diaz et al. | 439/573 |
| 5,959,244 | * 9/1999 | Mayer | 174/35 GC |
| 5,989,043 | * 11/1999 | Han et al. | 439/157 |

* cited by examiner

Primary Examiner—Gary F. Paumen
Assistant Examiner—Ross Gushi
(74) Attorney, Agent, or Firm—Rosenberg, Klein & Lee

(57) ABSTRACT

An improved structure of a interface card panel of a compact PCI system is disclosed. Wherein the panel of an interface card is assembled by welding an inner layered plate and an outer layered plate. The thickness of each layered plate is only half of the standard plate. The through holes of the inner layered plate have a radius only sufficient for receiving the screw rods of the fixing studs on the two ends of a D type connector, while the through holes for the outer layered plate have a radius sufficient for receiving the whole fixing studs, so that the fixing studs will completely pass through the outer layered plate, while the bodies thereof press the rim of the holes of the inner layered plate. Thus, other than the fixing points on the buckling bodies on the two ends thereof. By the fixing studs of the D type connector, a large fixing force is formed on the middle of the panel, and meanwhile, the strength of the panel is improved.

5 Claims, 5 Drawing Sheets

PANEL ASSEMBLY FOR COMPACT PCI SYSTEM INTERFACE CARD

BACKGROUND OF THE INVENTION

1. Field of the Invention

The present invention relates to an improved structure of an interface card panel assembly for a compact PCI system, wherein the panel for an interface card is assembled by welding together two plate layers, through holes formed in the inner plate layer opening access to a D type connector, while through holes formed in the outer plate layer are configured to pass a fixing stud that presses against the inner plate layer about its through holes. Via the fixing studs, a securing force is provided at an intermediate section of the panel, such that the overall strength of the panel is improved.

2. Description of the Prior Art

Compact PCI is a high level bus structure/standard for industrial computers. The specifications thereof are consistent with that of the PCI bus standard, but its mechanical specifications are different. It includes more stringent conductive contact and shock-resistance specifications. The most apparent difference in the use of an interface card in a compact PCI from the use of such in a general home-use computer is that the former adopts a front face connection, whereby a panel for the I/O port connector is oriented in parallel with the system bus connector. As a result, the panel of the interface card is also the panel of the machine so that the interface card is easily connected with the panel. In addition, the cables are easily checked and connected.

As shown in FIGS. 1 and 2, a compact PCI is formed by a panel (A), a circuit board (B) and a compact PCI interface card (C). The panel (A) and the circuit board (B) are secured by L-shaped seats (A11) of buckling bodies (A1) at the two ends (the buckling bodies are used to secure the panel and the machine's housing). No intermediate fixing point exists along the length of the panel (A). As a consequence, the middle of the panel (A) is easily deformed upon impact or pressure. Further, the inserting and pulling out of an interface card will apply a large force to the seat (A11). Each time the interface card is inserted or pulled out, a deforming force will be imparted to the seat (A11). Thus, the panel (A) may not remain perpendicular to the circuit board (B). After a long period of use, the seat (A11) is thus likely to be broken. Also, the panel (A) having a width that typically extends two slots in the given housing, is easily damaged on the seat.

Moreover, for a D type connector frequently used in an industrial computer or a home-use computer, fixing studs coupled at two ends thereof will press against a support bracket so that the connector is tightly connected to that bracket. However, where the T type connector is provided on an interface card, the thickness of a panel is typically limited to 1 mm, and thus an iron plate having a thickness of 1 mm replaces such bracket.

Industrial compact PCI employs panels having thicknesses of 2.5 mm for improved strength. As a consequence, the fixing studs of the D type connector cannot be used to secure the connector to the panel (A). In the prior art panel (A), the sizes of the through holes about the fixing studs of the connector are enlarged so that the hexagonal bodies of the fixing studs also pass therethrough. Therefore, the hexagonal bodies will not press against and capture the panel. This yields a large gap about the fixing stud, and the potential for electromagnetic interference (EMI) is accordingly increased.

Moreover, the compact PCI specifications indicate the right side of the panel (A) to be installed with an elastic conductor, such as a conductive rubber, a metal elastic piece, etc., for contacting the adjacent panel and improving EMI protection. To accommodate this, a vertical folded edge may be added to the right side of the panel. If the panel is made from aluminum, press molding or extrude molding fabrication techniques are available. However, these two methods of mold application are expensive. Given the market concerns touching on compact PCI, they are not economically feasible. If the panel were made from iron, a bending method may be used to finish a mold. But since the thickness employed is 2.5 mm, it is almost impossible to bend. Even if an iron panel may be bent, the bending corner will be formed with a cambered shaped to destroy the front surface contour of the panel (A). Therefore, prior art panels, made of either aluminum or iron, are formed as a planar plate and having connecting holes without provision for any elastic bodies. This not only deviates from the compact PCI specifications, it also hinders EMI abatement.

SUMMARY OF THE INVENTION

Accordingly, the object of the present invention is to provide an improved panel assembly for an interface card of a compact PCI system, wherein the panel assembly is assembled by welding together an inner plate layer and an outer plate layer, through hole portions being formed in the inner plate layer with sufficient diametric dimension to receive the screw rods of fixing studs of a D type connector, such that the inner plate is pressed by the hexagonal bodies of the fixing studs. Through holes formed in the outer plate layer are diametrically dimensioned to receive the fixing studs' hexagonal bodies. The D type connector may thus be tightly combined with the panel. Hence, the strength of the panel is improved. Moreover, the stability of coupling between the panel and the connector is improved, so that the panel resists vibration.

Another object of the present invention is to provide an improved interface card panel assembly for a compact PCI system, wherein the thickness of the inner plate layer does not exceed 1.0 mm, and the side of the inner plate layer is folded inwards to form a folding edge at which an elastic conductor is disposed. The outer plate layer need not be folded, and its frontal contour is preserved.

BRIEF DESCRIPTION OF THE DRAWINGS

The present invention will be better understood and its numerous objects and advantages will become apparent to those skilled in the art by referencing the following Drawings in which.

DETAILED DESCRIPTION OF THE PREFERRED EMBODIMENTS

Figure 1:
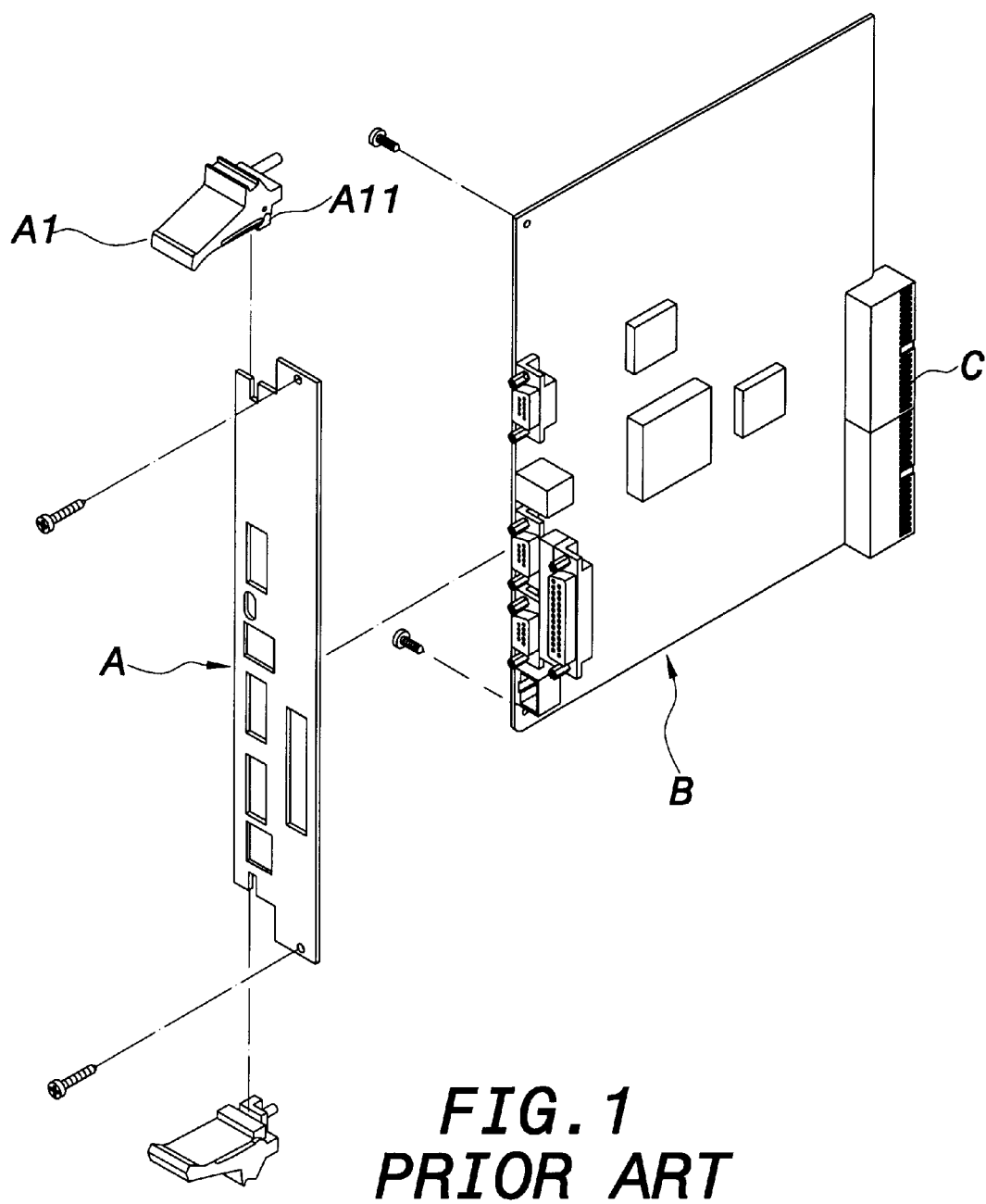
FIG. 1 is an exploded perspective view of a prior art interface card of a compact PCI system.
Figure 2:
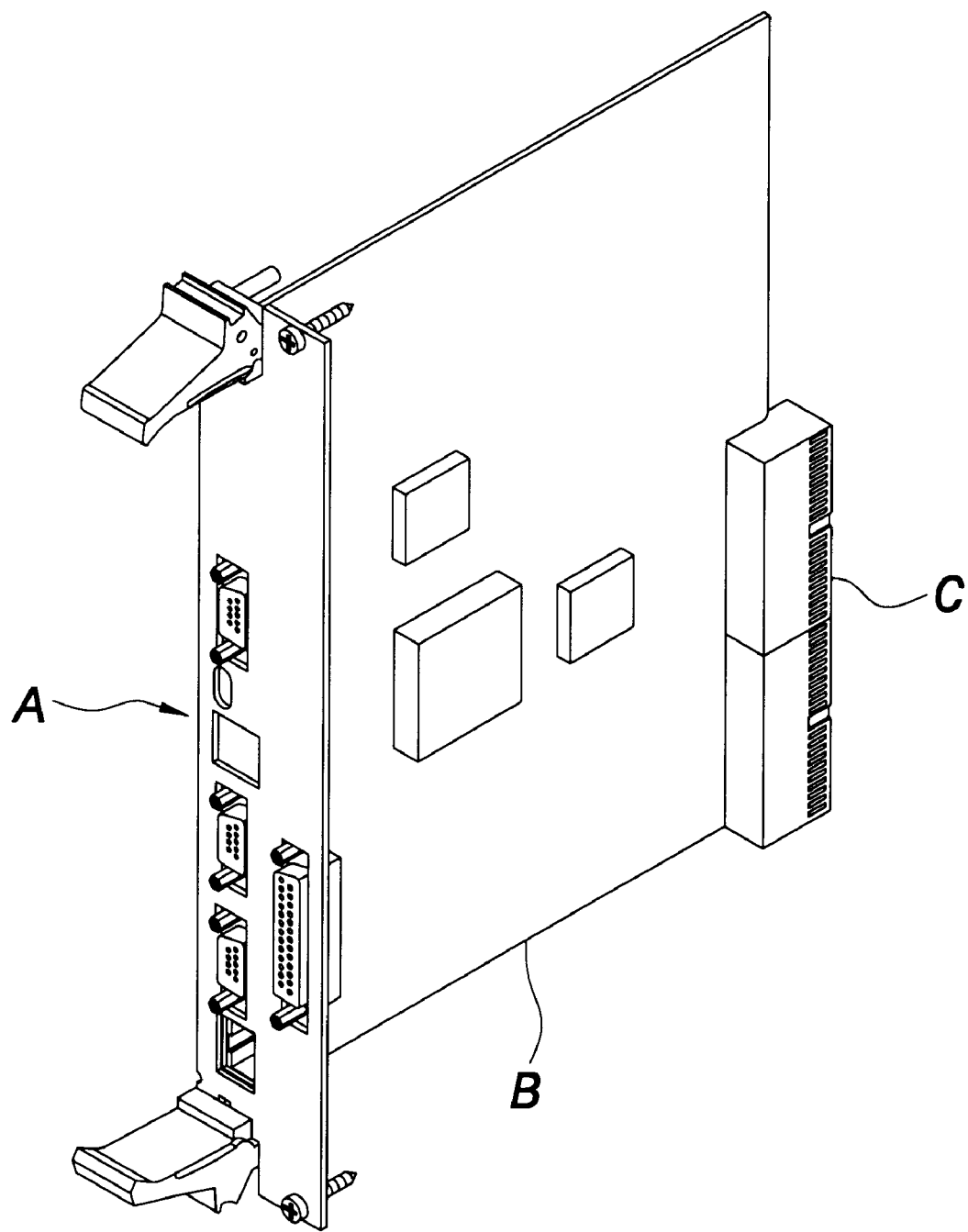
FIG. 2 is an assembled perspective view of a prior art interface card of a compact PCI system.
Figure 3:
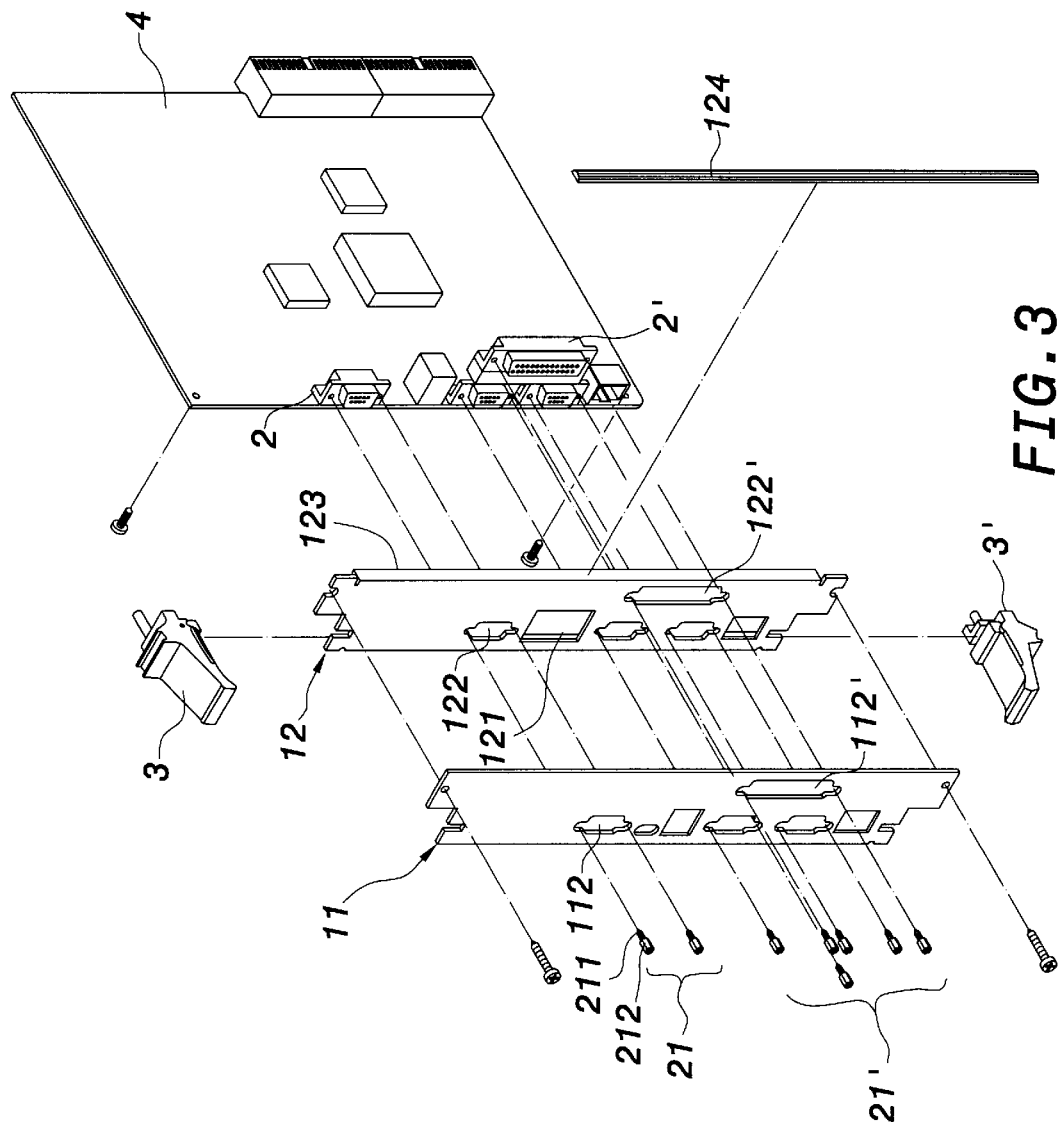
FIG. 3 is an exploded perspective view of one embodiment of the present invention.

Referring now to FIG. 3, an exploded perspective view of one embodiment of the present invention is illustrated. The present invention is employed with any interface card having at least one D type connector in a compact PCI system.

Since the D type connector is widely used, the present invention may be used with most interface cards. The panel assembly includes an inner plate layer (12) and an outer plate layer (11) which overlay each other and which are combined by welding or adhering in other ways. The plate layers (11, 12) overlay each in the sense that they are disposed one over the other such that a planar face of one generally covers the opposing planar face of the other. The thickness of the inner plate layer is 1.0 mm and that of the outer plate layer is 1.5 mm. After assembly, a standard total thickness of 2.5 mm is attained. For exposed connectors or switches other than D type connectors, the inner plate layer (12) and the outer plate layer (11) are formed with through holes dimensioned respectively to receive such elements.

To reduce cost, the inner plate layer (12) may be formed with an oversized through hole (121) for receiving at least two adjacent connectors other than a D type connector. This will not affect the appearance of the outer plate layer (11), yet will simplify the process for forming holes. At the locations of D type connectors (2, 2'), the plate layers (11, 12) are formed with appropriately configured and dimensioned through holes (122, 122', 112, 112'). At the fixing studs (21, 21') at the two ends of the connector, the inner plate layer (12) has a small radius opening portion for receiving therethrough a part of the rod (211, 211') of the given fixing stud (21, 21'). Whereas the radius of the corresponding opening portion of the outer plate layer (11) is larger to receive the whole fixing stud (21, 21'). Thus, an offset of surface layers results about the through holes of the plate layers (11, 12) so that the fixing studs (21, 21') will completely pass through the outer plate layer (11), while the hexagonal bodies (212, 212') press against the inner plate layer (12) when the rod (211, 211') engages the connector body through the opening therein. Thus, the inner plate layer (12) and the D type connector (2, 2') are tightly combined.

A plurality of buckling bodies (3, 3') are employed to securely lock a circuit board (4) and the panel assembly as in the prior art. Moreover, a folded edge (123) can be formed by bending inward one side of the inner plate layer (12). This is easily accomplished (since the thickness of the inner plate layer is only 1.0 mm). An elastic conductor (124) may then be installed as shown. Not only does this enable conformity with compact PCI standards, the appearance of the outer plate layer is not significantly affected.

Figure 4:
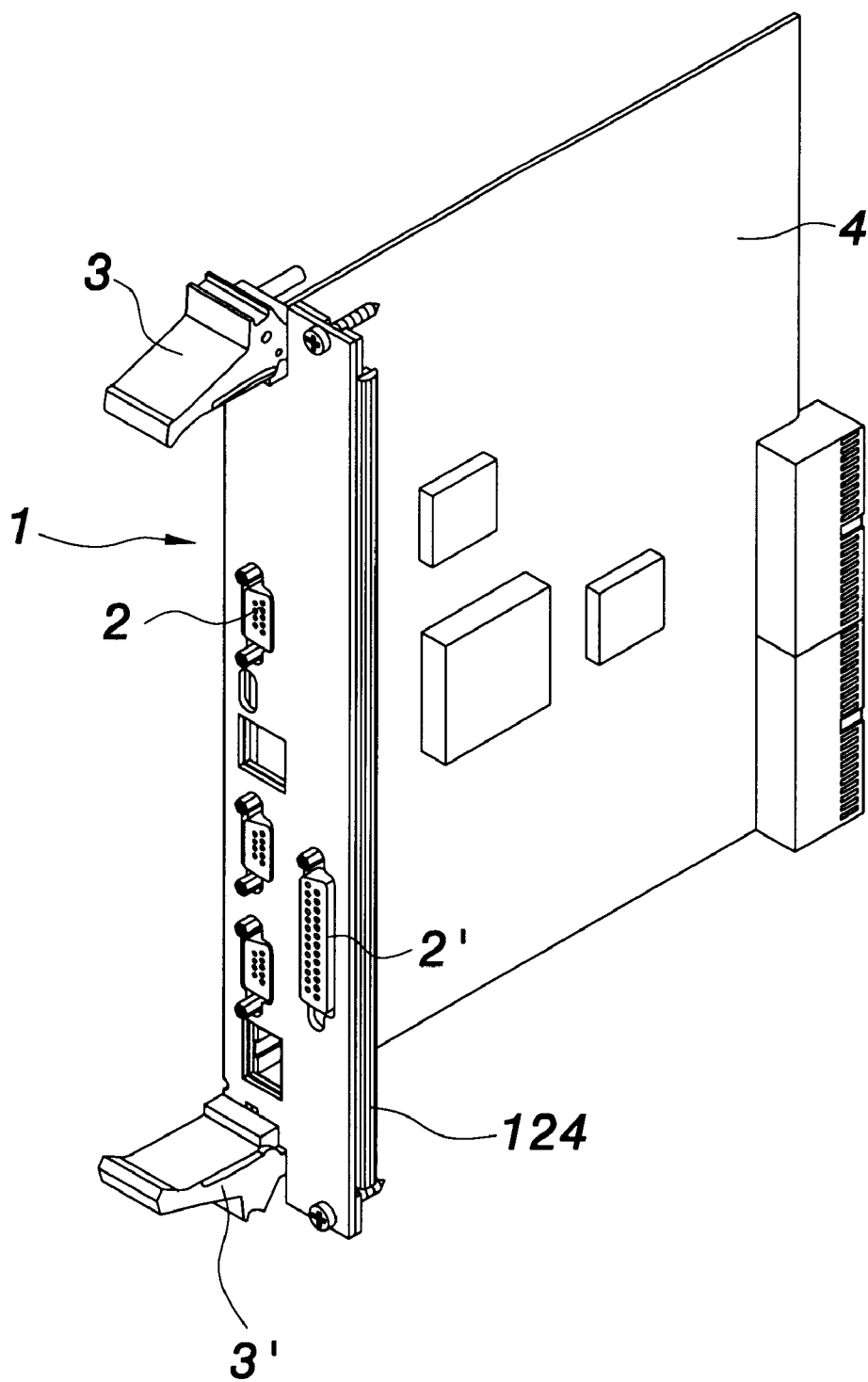
FIG. 4 is an assembled perspective view of the embodiment of the present invention of FIG. 3; and, FIG. 5 is an exploded perspective view of another embodiment of the present invention.

The assembled structure is shown in FIG. 4. By the design of the present invention, the advantages of D type connectors (2, 2') may be clearly realized. The D type connectors (2, 2') employed are tightly secured to the panel assembly (1). This enhances the strength of the panel assembly (1) so that it may better resist deformation due to external forces and thereby avoid damaging the buckling bodies (3, 3'). This leads ultimately to lowered costs.

Figure 5:
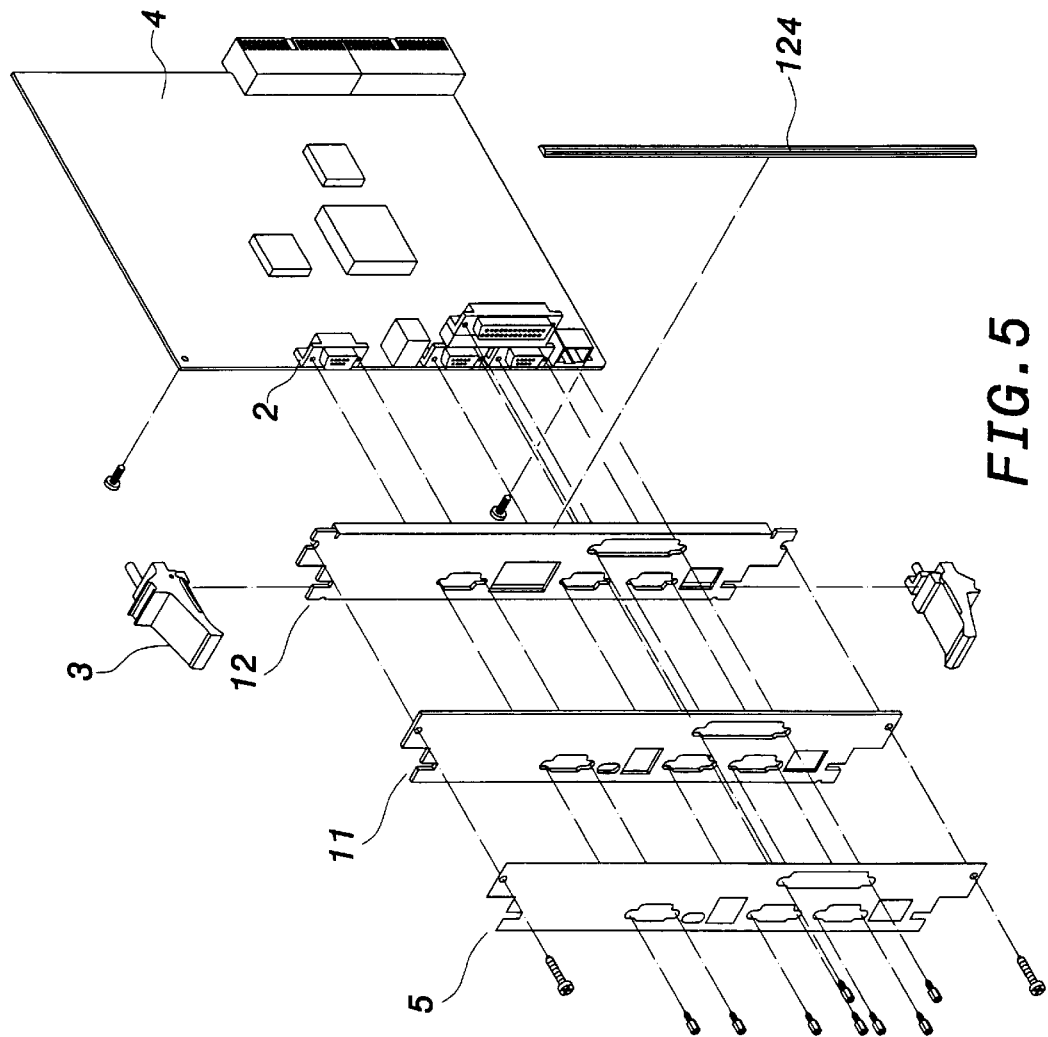

FIG. 5 shows a perspective view of another preferred embodiment of the present invention. In this embodiment, a card (5) is further adhered to the outer plate layer (11) for marking the functions of each connecter or interface card. The thickness of the outer plate layer (11) must be reduced to accommodate that of the cards (5) in order that the total thickness remains 2.5 mm. For example, if the thickness of the card (5) is 0.5 mm, then the outer plate layer (11) has a thickness of 1.0 mm equaling that of the inner plate layer (12).

Although the present invention has been described using specific embodiments, such exemplary embodiments are meant to be illustrative and not restrictive. It is clear that many other variations would be possible without departing from the basic approach demonstrated in the present invention. Therefore, all such variations are intended to be embraced within the scope of the invention as defined in the appended claims.

What is claimed is:

1. A panel assembly for a compact PCI system interface card having at least one D-type connector comprising:

(a) a plurality of fixing studs each having a hexagonal body portion and a rod portion projecting coaxially therefrom for engaging a peripheral portion of the D-type connector, said rod portion being less in diameter than said hexagonal body portion;

(b) at least one inner plate captured against the D-type connector by said fixing studs, said inner plate having a substantially planar wall portion and a folded edge portion extending transversely therefrom, said wall portion having formed therethrough at least one first opening for access to the D-type connector, said first opening including a main opening portion and a plurality of secondary opening portions disposed peripherally thereabout, each said secondary opening portion being less in diametric dimension than said hexagonal body portion but greater than said rod portion of said fixing stud; and, (c) at least one outer plate coupled to said inner plate, said outer plate having a substantially planar wall portion substantially overlaying said wall portion of said inner plate, said outer plate wall portion having formed therethrough at least one second opening communicating with at least one said first opening for access to the D-type connector, said second opening having a plurality of peripheral portions respectively aligned with said secondary opening portions of said first opening, each said second opening peripheral portion being greater in diametric dimension than said hexagonal body portion of said fixing stud;

whereby said hexagonal body portion of each said fixing stud passes through said outer plate to retentively engage said inner plate.

2. The panel assembly as recited in claim 1 wherein said inner and outer plates are adhered one to the other.

3. The panel assembly as recited in claim 1 wherein said inner plate is formed with a thickness dimension of at most 1.0 mm.

4. The panel assembly as recited in claim 1 further comprising an elastic conductor coupled to said folded edge portion of said inner plate.

5. The panel assembly as recited in claim 1 comprising at least a pair of said outer plates.

* * * * *